US 7,414,871 B2

(12) United States Patent
Lee et al.

(10) Patent No.: US 7,414,871 B2
(45) Date of Patent: Aug. 19, 2008

(54) PROGRAM CONTROL CIRCUIT OF FLASH MEMORY DEVICE HAVING MLC AND METHOD THEREOF

(75) Inventors: Hee Youl Lee, Icheon-si (KR); Hee Hyun Chang, Seongnam-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 11/776,844

(22) Filed: Jul. 12, 2007

(65) Prior Publication Data

US 2008/0013372 A1    Jan. 17, 2008

Related U.S. Application Data

(62) Division of application No. 11/275,281, filed on Dec. 21, 2005, now Pat. No. 7,259,976.

(30) Foreign Application Priority Data

Jun. 30, 2005   (KR)   ............... 2005-57813

(51) Int. Cl.
    *G11C 11/34*   (2006.01)
(52) U.S. Cl. ..................... 365/3; 365/185.19
(58) Field of Classification Search ............ 365/185.03, 365/185.19, 185.11
    See application file for complete search history.

(56) References Cited

U.S. PATENT DOCUMENTS

| 6,154,390 | A  | * | 11/2000 | Yang ..................... 365/185.21 |
| 6,418,053 | B1 | * | 7/2002  | Parker ................... 365/185.19 |
| 6,418,054 | B1 |   | 7/2002  | Hollmer |
| 6,747,894 | B2 | * | 6/2004  | Kawamura ............. 365/185.03 |
| 7,145,809 | B1 | * | 12/2006 | Wu ....................... 365/185.28 |
| 7,259,976 | B2 |   | 8/2007  | Lee et al. |

FOREIGN PATENT DOCUMENTS

| TW | 200402890 | 2/2004 |
| TW | 200428397 | 12/2004 |

* cited by examiner

*Primary Examiner*—Anh Phung
(74) *Attorney, Agent, or Firm*—Marshall, Gerstein & Borun LLP

(57) ABSTRACT

A program control circuit and method thereof selectively controls a supply time of a word line bias voltage depending on the number of program cycles being in progress. Therefore, over-programming of MLCs can be prevented and an overall program time can be shortened.

7 Claims, 6 Drawing Sheets

PROGRAM CONTROL CIRCUIT OF FLASH MEMORY DEVICE HAVING MLC AND METHOD THEREOF

This patent is a divisional of U.S. patent application Ser. No. 11/275,281 filed Dec. 21, 2005, now U.S. Pat. No. 7,259,976, issued on Aug. 21, 2007, the disclosure of which is hereby expressly incorporated for all purposes.

TECHNICAL FIELD

This patent relates to flash memory devices and more particularly, to a program control circuit of a flash memory device having MLCs and method thereof.

DISCUSSION OF RELATED ART

In general, memory cells of a flash memory device can be classified into a Single-Level Cell (SLC) and a Multi-Level Cell (MLC) depending on the number of data bits stored. One (1) bit data having a logic value of "1" or "0" can be stored in the SLC. Two (2) bits data having a logic value of any one of "11", "10", "01" and "00" can be stored in the MLC. Therefore, flash memory devices including MLCs are mainly used for high-integrated semiconductor devices requiring a large capacity of data space.

A program operation of the flash memory device including MLCs is performed on a page basis. This will be described in more detail. As a word line bias voltage for programming is applied to word lines connected to MLCs of a selected page, the MLCs are programmed.

Recently, to increase the program speed of the flash memory device, an incremental step pulse programming (ISPP) method of programming a selected page while gradually increasing the word line bias voltage every step (i.e., a program cycle) has been employed. In the program process of the flash memory device using the ISPP method, the threshold voltage of a MLC is changed to a voltage corresponding to a data value to be stored (any one of "11", "10", "01" and "00"). In this case, when the threshold voltages of the MLCs respectively corresponding to data [11], [10], [00] and [01] are Vt1, Vt2, Vt3 and Vt4, the voltages (Vt1 to Vt4) have the relationship Vt4>Vt3>Vt2>Vt1.

Meanwhile, a case where MLCs in which data of "00" should be stored (hereinafter referred to as "first MLCs") and MLCs in which data of "01" should be stored (hereinafter referred to as "second MLCs") coexist within word lines selected for program can be considered. In this case, the threshold voltage of the first MLCs has to be changed to a target threshold voltage Vt3 of an initial threshold voltage Vt2. The threshold voltage of the second MLCs has to be changed from an initial threshold voltage Vt1 to a target threshold voltage Vt4.

To reduce the program time, the program of the first and second MLCs is performed at the same time in the ISPP method. As shown in FIG. 1, as the number of program cycles increases, the threshold voltages of the first and second MLCs increases. This will be described in more detail below.

As the program operation is consecutively performed, the threshold voltage of the first MLCs is changed from Vt2 to Vt3 and the threshold voltage of the second MLCs is changed from Vt1 to Vt4. In this case, it is advantageous to apply a higher word line bias voltage in order to reduce the program time of the second MLCs. However, the word line bias voltage, which is set to increase the program speed of the second MLCs, is problematic in that it causes over-programming of the first MLCs (more particularly, the first MLCs having a high operating speed).

Furthermore, if the word line bias voltage is set in order to prevent the over-programming of the first MLCs, the program time of the second MLCs is increased. Therefore, a problem arises because an overall program time is increased.

SUMMARY OF THE INVENTION

A program control circuit of a flash memory device having MLCs may have a selectively controllable supply time of a word line bias voltage depending on the number of program cycles being in progress, thus preventing over-programming of the MLCs and shortening an overall program time.

A program control method of a flash memory device having MLCs may provide a selectively controllable supply time of a word line bias voltage depending on the number of program cycles being in progress, preventing an over-programming of the MLCs and reducing an overall program time.

A program control circuit of a flash memory device may include a plurality of MLCs that shares word lines and bit lines, including a controller, a clock signal generator and a voltage select circuit. The controller generates bit line masking signals and a step control signal in response to compare signals received from a verify data comparator, generates one of first to third cycle control signals and a first or second verify control signal based on the number of times that a step control signal is generated, outputs the bit line masking signals to a page buffer circuit connected to the bit lines, and outputs the step control signal to a word line voltage generator. The clock signal generator generates one of first to third clock signals and one of inverted first to third clock signals in response to one of the first to third cycle control signals. The voltage select circuit that outputs a program bias voltage, which is generated from the word line voltage generator, to a X-decoder connected to the word lines during one of first to third predetermined times or outputs a verify bias voltage, which is generated from the word line voltage generator, to the X-decoder during a fourth predetermined time, in response to one of the first to third clock signals and one of the inverted first to third clock signals, which are received from the clock signal generator.

A program control method of a flash memory device may include a plurality of MLCs that shares word lines and bit lines, including a first program step of programming MLCs of a selected page by applying a program voltage, which is increased by a step voltage, to a selected word line of the word lines during a first predetermined time in each of first to Ith (I is an integer) program cycles in response to a first cycle control signal; a second program step of programming the MLCs of the selected page by applying a first last program voltage (i.e., a program voltage that has been finally increased in the first program step) to the selected word line, while increasing the last program voltage by a step voltage, during a second predetermined time in each of first to (I+1)th to Jth (J is an integer) program cycles in response to a second cycle control signal; and a third program step of programming the MLCs of the selected page by applying a second last program voltage (i.e., a program voltage that has been finally increased in the second program step) to the selected word line, while increasing the second last program voltage by the step voltage, during a third predetermined time in each of first to (J+1)th to Kth (K is an integer) program cycles in response to a third cycle control signal.

DETAILED DESCRIPTION

Figure 1:
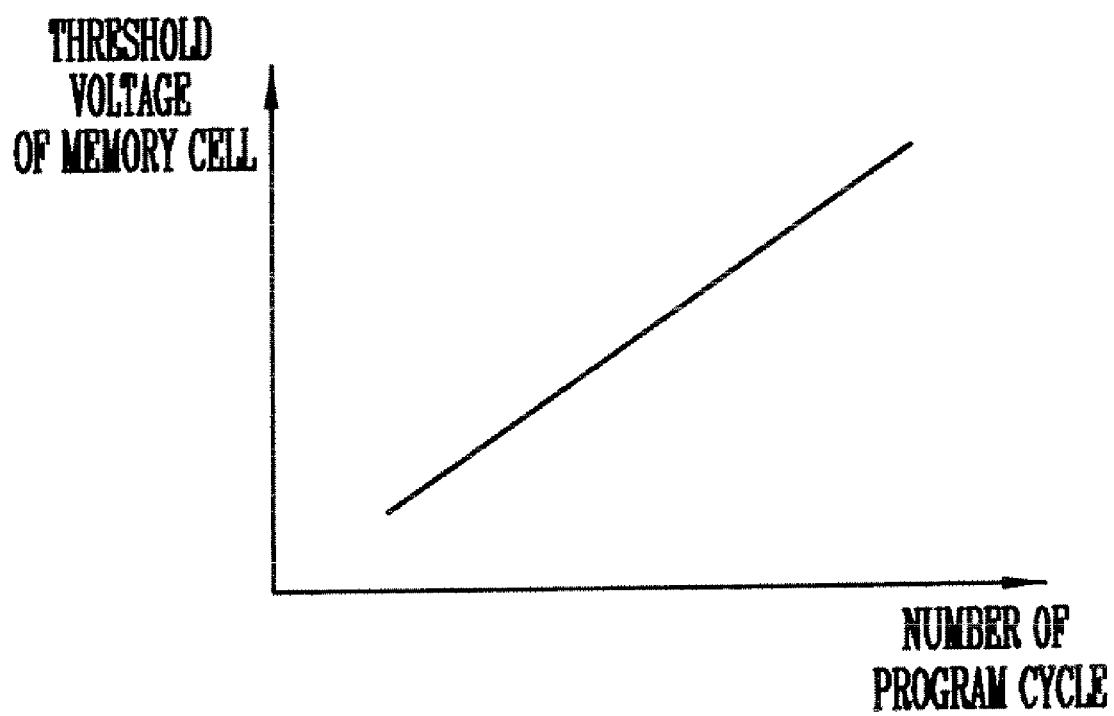
FIG. 1 is a graph showing variation in the threshold voltage of the MLC as the program cycle is in progress when the flash memory device is programmed by an Incremental Step Pulse Programming (ISPP) method in the related art.
Figure 2:
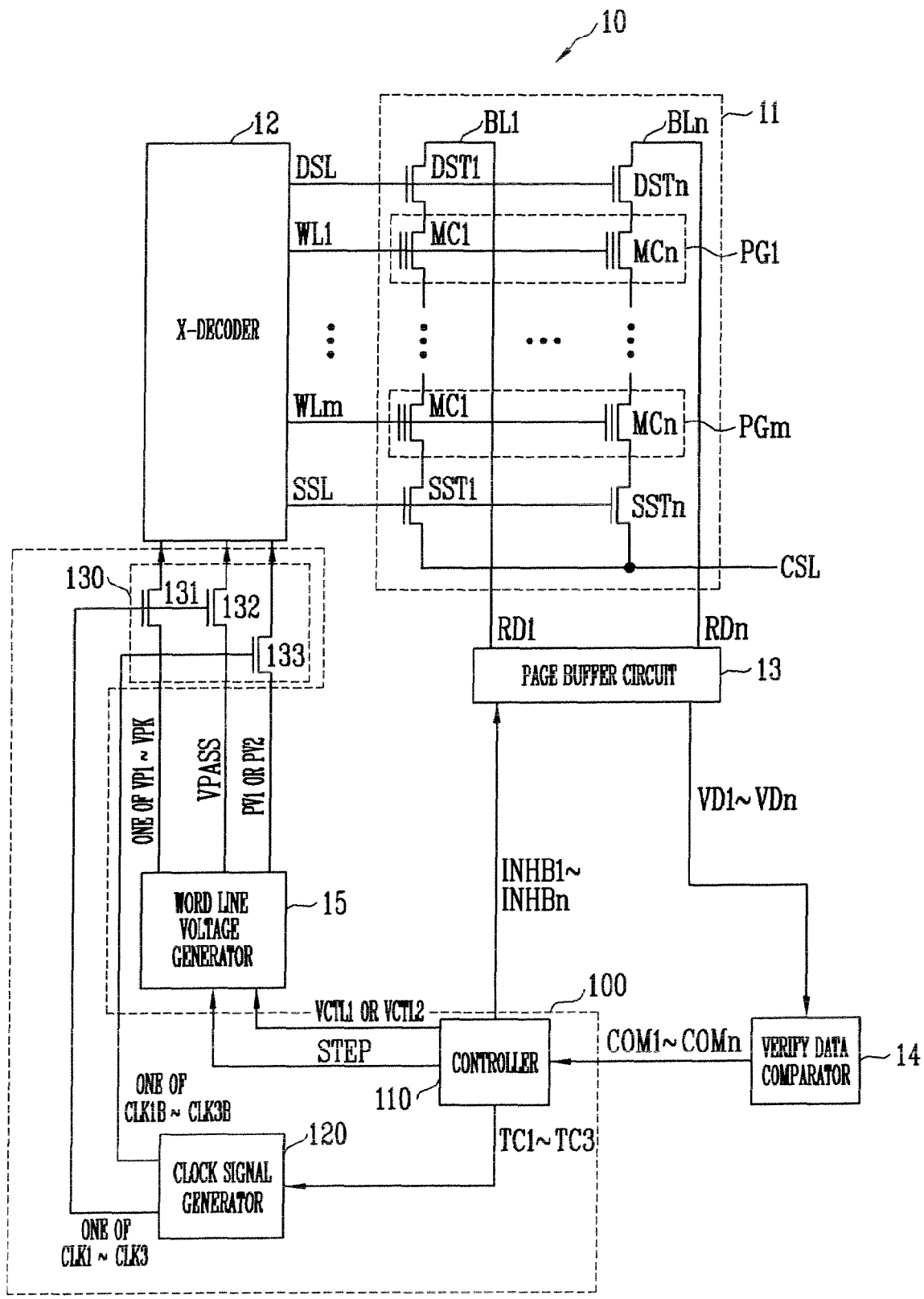
FIG. 2 is a circuit diagram schematically showing a flash memory device to which a program control circuit of a flash memory device according to one of the herein described embodiments.

FIG. 2 is a circuit diagram schematically showing a flash memory device to which a program control circuit of a flash memory device using the ISSP method is applied. It is to be understood that FIG. 2 shows only portions related to the program operation of the flash memory device 10 for the purpose of simplicity.

Referring to FIG. 2, the flash memory device 10 may include a memory cell array 11, a X-decoder 12, a page buffer circuit 13, a verify data comparator 14, a word line voltage generator 15 and a program control circuit 100.

The memory cell array 11 includes a plurality of pages PG1 to PGm having word lines WL1 to WLm (m is an integer) and MLCs MC1 to MCn that share bit lines BL1 to BLn (n is an integer). The memory cell array 11 further includes drain select transistors DST1 to DSTn respectively connected between the MLCs MC1 to MCn of the page PG1 and the bit lines BL1 to BLn, and source select transistors SST1 to SSTn respectively connected between the MLCs MC1 to MCn of the page PGm and a common source line CSL. The gates of the drain select transistors DST1 to DSTn are connected to the drain select line DSL and the gates of the source select transistors SST1 to SSTn are connected to the source select line SSL.

The X-decoder 12 decodes a row address signal (not shown) and selects one of the word lines WL1 to WLm (i.e., one of the pages PG1 to PGm) according to the decoding result. The X-decoder 12 supplies a program voltage (one of PV1 to PVK) (K is an integer) to a selected word line (one of WL1 to WLm) or supplies a first or second verify voltage (VP1 or VP2).

Figure 4:
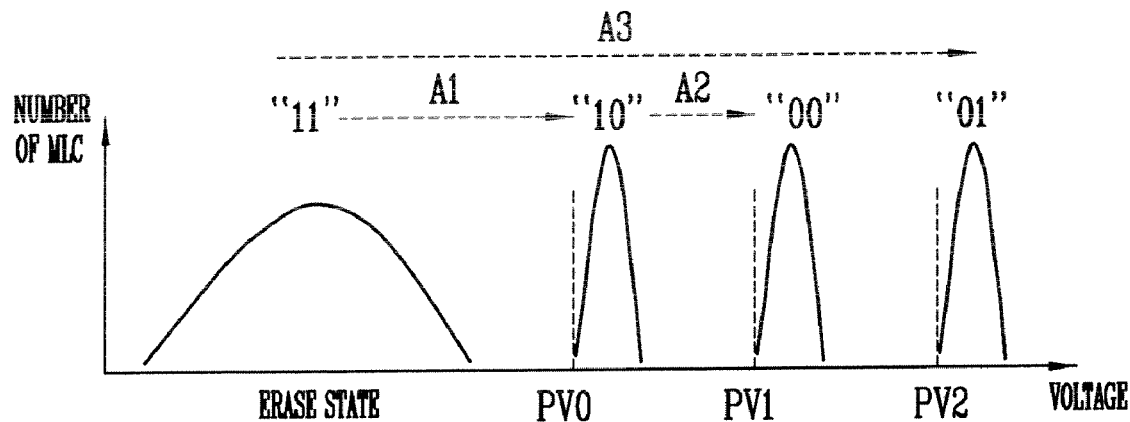
FIG. 4 is a graph showing the threshold voltage distribution of the MLC depending on the program process of the flash memory device shown in FIG. 3.

Furthermore, when applying the program voltage (one of VP1 to VPK) to a selected word line (one of WL1 to WLm), the X-decoder 12 applies a pass voltage (VPASS) to the remaining word lines. As shown in FIG. 4, the first verify voltage (VP1) can be set to a threshold voltage of a MLC that has been programmed as "00", and the second verify voltage (VP2) can be set to a threshold voltage of a MLC that has been programmed as "01".

The page buffer circuit 13 applies a bit line bias voltage (not shown) for prohibiting programming to some of the bit lines BL1 to BLn in response to bit line masking signals (INHB1 to INHBn) (n is an integer). Furthermore, the page buffer circuit 13 outputs verify data (VD1 to VDn) in response to read data (RD1 to RDn), which are respectively received from selected pages (PG1 to PGm) through the bit lines BL1 to BLn.

Furthermore, the page buffer circuit 13 outputs the verify data (VD1 to VDn) as logic '1' when the read data (RD1 to RDn) are logic '0' (i.e., when MLCs MC1 to MCn of a selected page (one of PG1 to PGm) have not been programmed). In addition, the page buffer circuit 13 outputs the verify data (VD1 to VDn) as logic '0' when the read data (RD1 to RDn) are logic '1' (i.e., when MLCs MC1 to MCn of a selected page (one of PG1 to PGm) have been programmed).

Alternately, the page buffer circuit 13 can output the verify data (VD1 to VDn) as logic '0' when the read data (RD1 to RDn) are logic '0' (i.e., when MLCs MC1 to MCn of a selected page (one of PG1 to PGm) have not been programmed) and can output the verify data (VD1 to VDn) as logic '1' when the read data (RD1 to RDn) are logic '1' (i.e., when MLCs MC1 to MCn of a selected page (one of PG1 to PGm) have been programmed).

The verify data comparator 14 compares the verify data (VD1 to VDn) with reference data (not shown), respectively, and output compare signals (COM1 to COMm) The verify data comparator 14 can also be designed to output the compare signals (COM1 to COMn) as logic low when the verify data (VD1 to VDn) are identical with the reference data and output the compare signals (COM1 to COMn) as logic high when the verify data (VD1 to VDn) are not identical with the reference data. Furthermore, the reference data can be set to logic '0'.

For example, when the read data (RD1) are logic '0' (i.e., when MLC MC1 of a selected page (one of PG1 to PGm) have not been programmed), the verify data comparator 14 can output the verify data (VD1) as logic '1'. As a result, the verify data comparator 14 are logic '01 (i.e., when MLC MC1 of a selected page (one of PG1 to PGm) have been programmed), the verify data comparator 14 can output the verify data (VD1) as logic '0'. As a result, the verify data comparator 14 outputs the compare signal (COM1) as logic low.

The word line voltage generator 15 generates the first verify voltage (PV1) in response to a first verify control signal (VCTL1) and generates the second verify voltage (PV2) in response to a second verify control signal (VCTL2). Furthermore, the word line voltage generator 15 generates a program voltage (one of VP1 to VPK) (K is an integer) and the pass voltage (VPASS) in response to a step control signal (STEP).

The word line voltage generator 15 can generate the program voltage (VP1) when the step control signal (STEP) is initially received, and can consecutively output the program voltages (VP1 to VPK) in order of VP1, VP2, VP3 ..., VPK whenever the step control signal (STEP) is received. The amount of the program voltages (VP1 to VPK) can be expressed in the following Equation.

$$Vp2 = Vp1 + Vs,$$

$$Vp2 = Vp1 + Vs,$$

E

E

E $$VpK = Vp(K-1) + Vs$$

where Vs is a step voltage.

The program control circuit 100 includes a controller 10, a clock signal generator 120 and a voltage select circuit 130. The controller 110 generates the bit line masking signals (INHB1 to INHBn) and the step control signal (STEP) in response to the compare signals (COM1 to COMn). The controller 110 can output the step control signal (STEP) as a high pulse signal form.

Furthermore, the controller 110 outputs one of first to third cycle control signals (TC1 to TC3) and the first or second verify control signal (VCTL1 or VCTL2) based on the number of the step control signal (STEP) that is generated. The controller 110 outputs the first cycle control signal (TC1) and the first verify control signal (VCTL1) until the number of the step control signal (STEP) that is generated reaches Ith (I is an integer).

Furthermore, the controller 110 outputs the second cycle control signal (TC2) and the first or second verify control signal (VCTL1 or VCTL2) until the number of the step control signal (STEP) that is generated reaches (I+1)th to Jth (J is an integer greater than I). Furthermore, the controller 110 can alternately generate the first verify control signal (VCTL1) and the second verify control signal (VCTL2) in each verify operation. This will be described in more detail later on.

For example, in a verify operation of the MLCs MC1 to MCn, which is executed after the MLCs MC1 to MCn of the page (PG1) is programmed at a (n+1)th position in the sequence, the controller 110 generates only the first verify control signal (VCTL1). Furthermore, in a verify operation of the MLCs MC1 to MCn, which is executed after the MLCs MC1 to MCn of the page (PG1) is programmed at a (n+1)th position in the sequence, the controller 110 generates only the second verify control signal (VCTL2). Alternately, the controller 110 can consecutively generate the first verify control signal (VCTL1) and the second verify control signal (VCTL2) in one verify operation. This will be described in more detail later on. In a verify operation of the MLCs MC1 to MCn, which is executed after the MLCs MC1 to MCn of the page (PG1) is programmed at a (n+1)th position in the sequence, the controller 110 generates the first verify control signal (VCTL1) and then generates the second verify control signal (VCTL2).

Furthermore, the controller 110 outputs the third cycle control signal (TC3) and the second verify control signal (VCTL2) until the number of times that the step control signal (STEP) is generated reaches (J+1)th to Kth (K is an integer greater than J).

The clock signal generator 120 generates a first clock signal (CLK1) and an inverted first clock signal (CLK1B) when receiving the first cycle control signal (TC1). Furthermore, the clock signal generator 120 generates a second clock signal (CLK2) and an inverted second clock signal (CLK2B) when receiving the first cycle control signal (TC2). Furthermore, the clock signal generator 120 generates a third clock signal (CLK3) and an inverted third clock signal (CLK3B) when receiving the third cycle control signal (TC3).

Figure 6:
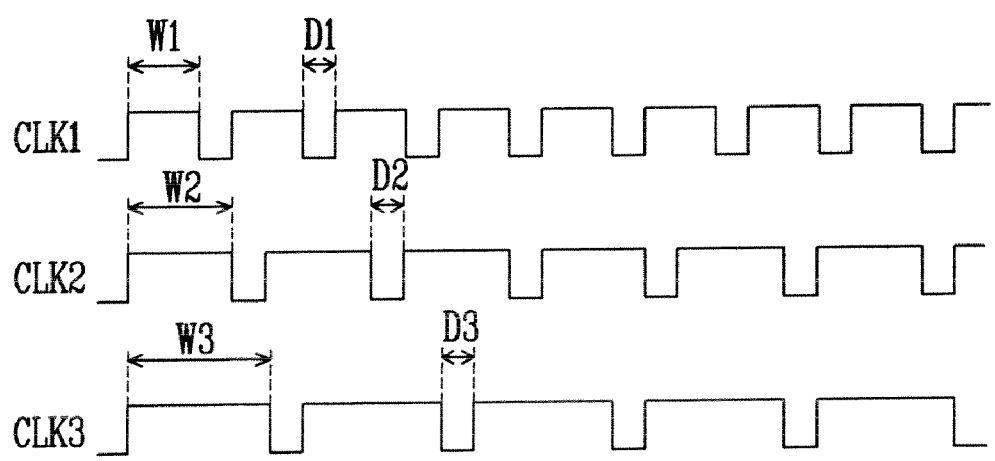
FIG. 6 is a timing diagram of first to third clock signals shown in FIG. 2.

FIG. 6 is a timing diagram of the first to third clock signals (CLK1 to CLK3) shown in FIG. 2.

As can be seen from FIG. 6, one cycle of the third clock signal (CLK3) is greater than one cycle of the second clock signal (CLK2) and one cycle of the second clock signal (CLK3) is greater than one cycle of the first clock signal (CLK1). The logic high periods can be set to be longer than the logic low periods (i.e., the disable periods) (D1, D2, D3), respectively. Furthermore, the logic low periods (D1, D2, D3) of the first to third clock signals (CLK1 to CLK3) can be set to be the same.

The voltage select circuit 130 includes first to third switching circuits 131 to 133. Each of the first to third switching circuits 131 to 133 can be implemented using an NMOS transistor. The first switching circuit 131 is connected between the program voltage (one of VP1 to VPK) and the X-decoder 12 and is turned on or off in response to one of the first to third clock signals (CLK1 to CLK3).

The second switching circuit 132 is connected between the pass voltage (VPASS) and the X-decoder 12 and is turned on or off in response to one of the first to third clock signals (CLK1 to CLK3). The third switching circuit 133 is connected between the first or second verify voltage (PV1 or PV2) and the X-decoder 12 and turned on or off in response to one of the inverted first to third clock signals (CLK1B to CLK3B). Consequently, when the first and second switching circuits 131, 132 are turned on at the same time, the third switching circuit 133 is turned off. To the contrary, when the third switching circuit 133 is turned on, the first and second switching circuits 131, 132 are turned off at the same time.

The program operation of the flash memory device 10 will now be described in detail.

Figure 3:
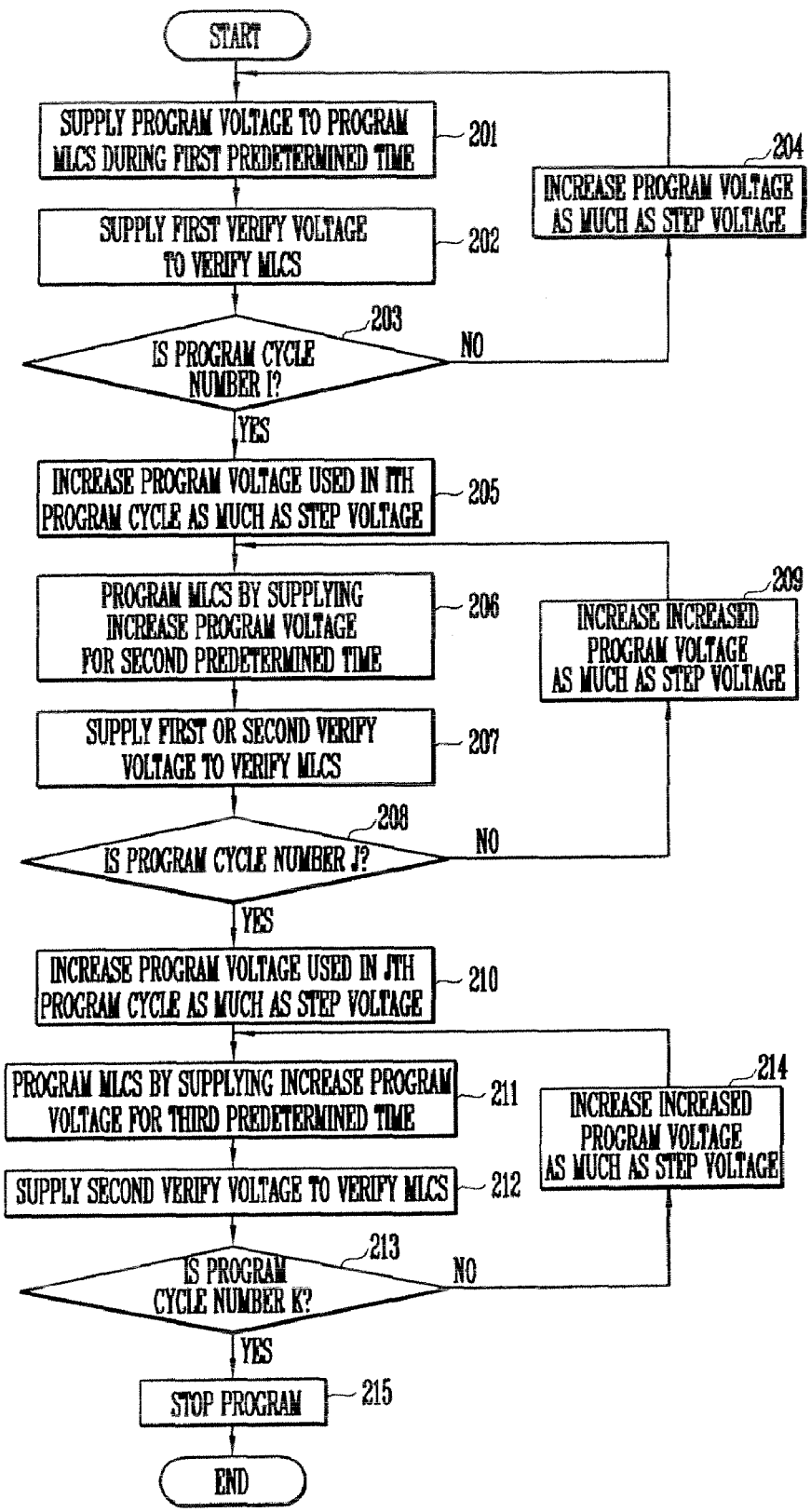
FIG. 3 is a flowchart illustrating a program process of the flash memory device, which is performed by the program control circuit shown in FIG. 2.

FIG. 3 is a flowchart (200) illustrating the program process of the flash memory device, which is performed by the program control circuit shown in FIG. 2. In the present embodiment, a case where the MLCs MC1 to MCn of the page (PG1) are programmed, data "00" are programmed into the MLCs MC1 to MC8 and data "01" are programmed into the MLCs MC9 to MCn will be described as an example.

Referring to FIG. 3, at step 201, during a first predetermined time, the X-decoder 12 supplies the word line WL with the program voltage (VP1) to program the MLCs MC1 to MCn. The program process of the MLCs MC1 to MCn will be described in more detail below.

The controller 110 first generates the step control signal (STEP), the first cycle control signal (TC1) and the first verify control signal (VCTL1). The word line voltage generator 15 generates the program voltage (PV1) and the pass voltage (VPASS) in response to the first verify control signal (VCTL1).

Furthermore, the clock signal generator 120 outputs the first clock signal (CLK1) and the inverted first clock signal (CLK1B) in response to the first cycle control signal (TC1). As a result, the first and second switching circuits 131, 132 of the voltage select circuit 130 are turned on in response to the first clock signal (CLK1), but the third switching circuit 133 is turned off. The first and second switching circuits 131, 132 can keep turned on during a first predetermined time (i.e., the enable period (W1, refer to FIG. 6) of the first clock signal (CLK1)).

Therefore, the X-decoder 12 is supplied with the program voltage (PV1) and the pass voltage (VPASS) during the first predetermined time and the X-decoder 12 supplies the word line WL1 with the program voltage (PV1) during the first predetermined time. Furthermore, the X-decoder 12 supplies the remaining word lines WL2 to WLm with the pass voltage (VPASS) during the first predetermined time.

As a result, the MLCs MC1 to MCn of the page (PG1) are programmed. At this time, the page buffer circuit 13 is loaded with data (not shown) to be programmed. In this case, since data "00" must be programmed into the MLCs MC1 to MC8, lower bit data "0" are first programmed into the MLCs MC1 to MC8.

That is, the threshold voltage of the MLCs MC1 to MC8 is changed to a voltage level corresponding to data "10" (refer to A1 in FIG. 4). Meanwhile, since data "01" must be programmed into the MLCs MC9 to MCm, the bit line bias voltage for prohibiting program is applied to the bit lines BL9 to BLn while the lower bit data "0" are programmed into the MLCs MC1 to MC8, so that the MLCs MC9 to MCm are not programmed.

Thereafter, at step 202, the X-decoder 12 supplies the word line WL with the first verify voltage (PV1) to verify the MLCs MC1 to MCn. The reason why the verify process of step 202 is performed is for allowing the threshold voltage distribution of the MLCs MC1 to MC8 to be moved within a set voltage range.

Figure 5:
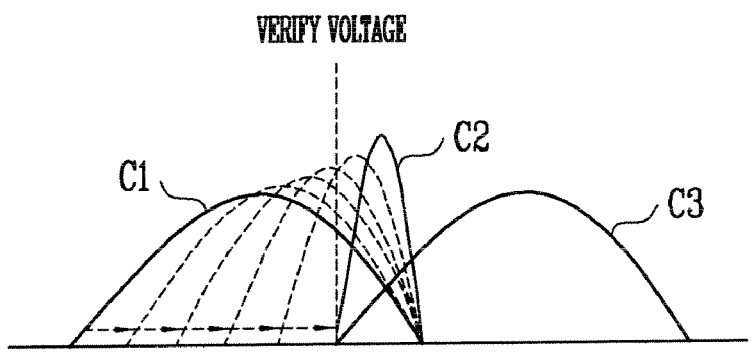
FIG. 5 is a graph showing the threshold voltage distribution of MLCs before and after a verify operation is executed in the program process of the flash memory device by the program control circuit.

Referring to FIG. 5, the threshold voltages of the MLCs MC1 to MC8 are distributed as indicated by a graph "C1" in an erase state. Therefore, if the same program voltage (i.e., the word line bias voltage) is applied to the MLCs MC1 to MC8 without performing the verify process, the threshold voltages of the MLCs MC1 to MC8 are distributed as indicated by a graph "C3".

As a result, the graph "C1" is entirely moved to the graph "C3". However, if the verify process is performed, a bias voltage for prohibiting program is applied to corresponding bit lines so that MLCs on which program has been completed are not programmed any more. Therefore, the threshold voltages of the MLCs MC1 to MC8 are distributed as indicated by a graph "C2".

The verify process of the MLCs MC1 to MCn will be described in more detail below. The third switching circuit 133 of the voltage select circuit 130 is turned on for the predetermined time (D1) in response to the inverted clock signal (CLK1B) and outputs the first verify voltage (PV1) to the X-decoder 12. As a result, the X-decoder 12 supplies the word line WL1 with the first verify voltage (PV1).

Meanwhile, though not shown in FIG. 2, the word line voltage generator 15 further generates a read voltage (not shown), such as 4.5V. The X-decoder 12 applies the read voltage to the remaining word lines WL2 to WLm. The MLCs MC1 to MCn are turned on or off according to a program state. For example, in the case where the MLCs MC1 to MCn are not programmed, the MLCs MC1 to MCn are turned on. In the case where the MLCs MC1 to MCn are programmed, the MLCs MC1 to MCn are turned off. For example, in the case where only the MLC MC1 is programmed, the MLC MC1 can be turned on and the MLCs MC2 to MCn can be turned on.

As a result, the MLC MC1 outputs the read data (RD1) to the bit line BL1 as logic '1' and the MLCs MC2 to MCn output the read data (RD2 to RDn) to the bit lines BL2 to BLn as logic '0'. The page buffer circuit 13 outputs the verify data (VD1) as logic '0' in response to the read data (RD1) and outputs the verify data (VD2 to VDn) as logic '1' in response to the read data (RD2 to RDn).

The verify data comparator 14 compares the verify data (VD1 to VDn) with the reference data and outputs the compare signals (COM1 to COMn) as the comparison result. In more detail, the verify data comparator 14 outputs the compare signal (COM1) as logic low and the compare signals (COM2 to COMn) as logic high.

The controller 110 outputs the step control signal (STEP) and the bit line masking signals (INHB1 to INHBn) in response to the compare signals (COM1 to COMn). As a result, the page buffer circuit 13 supplies the bit line bias voltage for prohibiting program to the bit line BL1 in response to the bit line masking signals (INHB1 to INHBn).

At step 203, the controller 110 counts the number of times that the step control signal (STEP) has been generated to determine whether the program cycle number is I. If the number of times that the step control signal (STEP) has been generated is I, the controller 110 determines that the program cycle number is I. If the number of times that the step control signal (STEP) has been generated is not I, the word line voltage generator 15 increases the program voltage (VP1) as much as the step voltage (Vs, see FIG. 7) in response to the step control signal (STEP) at step 204.

Thereafter, the steps 201 to 203 are repeatedly performed until the number of the program cycle becomes I.

Figure 7:
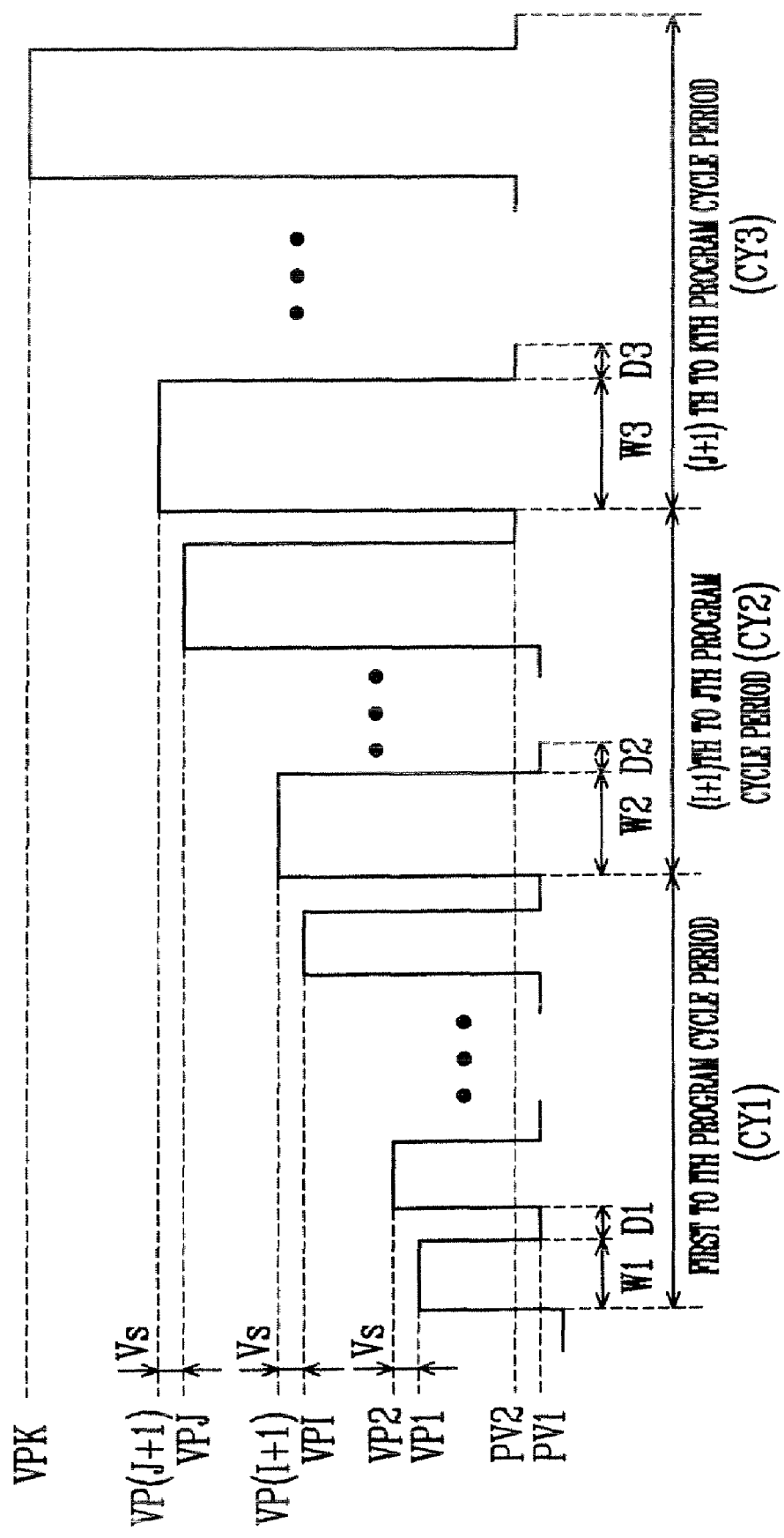
FIG. 7 is a view showing variation in the voltage of a word line according to a herein described programming process.

Referring to FIG. 7, a program voltage applied to the word line WL1 during a first to Ith program cycle period (CY1), gradually rises as much as the step voltage (Vs). That is, during the first to Ith program cycle period (CY1), VP1, VP2, . . . , VPI are continuously supplied to the word line WL1 as the program voltage. Furthermore, if the controller 110 has determined that the program cycle number of I at step 203, the program operation of the step 202 is stopped.

Thereafter, at step 205, the program voltage (VPI) used in the Ith program cycle is increased as much as the step voltage (Vs). This will be described in more detail below.

The controller 110 generates the step control signal (STEP), the second cycle control signal (TC2) and the first or second verify control signal (VCTL1, VCTL2). The word line voltage generator 15 generates a program voltage (PV(I+1)) in which the program voltage (VPI) has been increased as much as the step voltage (Vs), and the pass voltage (VPASS) in response to the step control signal (STEP), and generates the first or second verify voltage (PV1 or PV2) in response to the first or second verify control signal (VCTL1 or VCTL2).

Furthermore, at step 206, the X-decoder 12 programs the MLCs MC2 to MCn by supplying the word line WL1 with the program voltage (PV(I+1)) for a second predetermined time. In this case, the program process of the step 206 is the same as the aforementioned step 201 except for the program voltage supplied to the word line WL1 and the supply time. Description thereof will be omitted in order to avoid redundancy. Furthermore, the process in which the X-decoder 12 supplies the word line WL1 with the program voltage (PV(I+1)) during the second predetermined time will be described in more detail below.

The clock signal generator 120 outputs the second clock signal (CLK2) and the inverted second clock signal (CLK2B) in response to the second cycle control signal (TC2). As a result, the first and second switching circuits 131, 132 are turned on in response to the second clock signal (CLK2) and the third switching circuit 133 is turned off.

The first and second switching circuits 131, 132 keep turned on during the second predetermined time (i.e., the enable period (refer to W2 in FIG. 6) of the second clock signal (CLK2)). Therefore, the X-decoder 12 is supplied with the program voltage (PV(I+1)) and the pass voltage (VPASS) during the second predetermined time, and the X-decoder 12 supplies the word line WL1 with the program voltage (PV(I+1)) during the second predetermined time. At this time, the page buffer circuit 13 is loaded with data (not shown) to be programmed.

In this case, in the case where data "00" are programmed into the MLCs MC1 to MC8, upper bit data "0" are programmed into the MLCs MC1 to MC8 and at the same time, upper bit data "0" are programmed into the MLCs MC9 to MCm. That is, the threshold voltage of the MLCs MC1 to MC8 is changed from data "10" to a voltage level corresponding to the data "00" (see A2 in FIG. 4). The threshold voltage of the MLCs MC9 to MCm is changed from data "11" to a voltage level corresponding to the data "01" (see A3 in FIG. 4).

Thereafter, at step 207, the X-decoder 12 supplies the word line WL1 with the first or second verify voltage (PV1 or PV2) to verify the MLCs MC1 to MCn. The verify process of the step 207 is the same as the aforementioned step 202 except for the verify voltage applied to the word line WL1. Description thereof will be omitted in order to avoid redundancy.

At step 207, the X-decoder 12 alternately supplies the first verify voltage (PV1) and the second verify voltage (PV2) to the word line WL1 in different verify operation periods. For example, the controller 110 can generate the first verify control signal (VCTL1) in the verify operation that is performed after a (I+1)th program cycle, and generate the second verify control signal (VCTL2) in the verify operation that is performed after a (I+2)th program cycle.

As a result, the word line voltage generator 15 generates the first verify voltage (PV1) in the verify operation that is performed after the (I+1)th program cycle and generates the second verify voltage (PV2) in the verify operation that is performed after the (I+2)th program cycle. Therefore, the X-decoder 12 can alternately supply the first verify voltage (PV1) and the second verify voltage (PV2) to the word line WL1 during different verify operation periods.

Alternately, at step 207, the X-decoder 12 can consecutively supply the first verify voltage (PV1) and the second verify voltage (PV2) to the word line WL1 in the same verify operation period. For example, the controller 110 can generate the first verify control signal (VCTL1) in the verify operation that is performed after the (I+1)th program cycle and then generate the second verify control signal (VCTL2) in the verify operation that is performed after the (I+2)th program cycle.

As a result, the word line voltage generator 15 generates the first verify voltage (PV1) in the verify operation that is performed after the (I+1)th program cycle and then generates the second verify voltage (PV2).

Thereafter, at step 208, the controller 110 counts the number of times that the step control signal (STEP) has been generated to determine whether the program cycle number is J. If it is determined that the number of times that the step control signal (STEP) is generated is J, the controller 110 determines whether the program cycle number is J.

If it is determined that the number of times that the step control signal (STEP) is generated is not J, the word line voltage generator 15 increases the program voltage (VP(I+1)) as much as the step voltage (refer to Vs in FIG. 7) in response to the step control signal (STEP) as step 209. Thereafter, the steps 206 to 208 are repeatedly performed until the program cycle number becomes J.

Referring to FIG. 7, the program voltage supplied to the word line WL1 during the (I+1)th to jth program cycle period (CY2) is gradually increased as much as the step voltage (Vs). VP(I+1), VP(I+2), . . . , VPJ are consecutively supplied to the word line WL1 as the program voltage during the (I+1)th to jth program cycle period (CY2).

Furthermore, if the controller 110 has determined that the program cycle number is K at step 208, the program operation of the step 206 is stopped.

Thereafter, at step 210, the program voltage (VPJ) used in the jth program cycle is increased as much as the step voltage (Vs).

Furthermore, at step 211, the X-decoder 12 programs the MLCs MC2 to MCn by supplying the word line WL1 with the program voltage (PV(J+1)) during a third predetermined time. The program process of the step 211 is the same as aforementioned the step 201 except for the program voltage applied to the word line WL1 and the supply time. Therefore, description thereof will be omitted in order to avoid redundancy. In this case, the process in which the X-decoder 12 applies the program voltage (PV(J+1)) to the word line WL1 during the third predetermined time will be described in detail below.

The clock signal generator 120 outputs the third clock signal (CLK3) and the inverted third clock signal (CLK3B) in response to the third cycle control signal (TC3). As a result, the first and second switching circuits 131, 132 are turned on in response to the third clock signal (CLK3) and the third switching circuit 133 is turned off. The first and second switching circuits 131, 132 can preferably keep turned on during the third predetermined time (i.e., the enable period (refer to W3 in FIG. 6) of the third clock signal (CLK3)).

Therefore, the X-decoder 12 is supplied with the program voltage (PV(J+1)) and the pass voltage (VPASS) during the third predetermined time, and the X-decoder 12 applies the program voltage (PV(J+1)) to the word line WL1 during the third predetermined time. At this time, the page buffer circuit 13 is loaded with data (not shown) to be programmed. In this case, in the case where data "01" are programmed into the MLCs MC1 to MC8, the program into the MLCs MC1 to MC8 is stopped and the upper bit data "0" are programmed into the MLCs MC9 to MCm.

Thereafter, at step 212, the X-decoder 12 applies the second verify voltage (PV2) to the word line WL1 to verify the MLCs MC1 to MCn. The verify process of the step 212 is the same as the aforementioned step 202 except for the verify voltage applied to the word line WL1. Description thereof will be omitted in order to avoid redundancy.

Thereafter, at step 213, the controller 110 counters the number of times that the step control signal (STEP) has been generated to determine whether the program cycle number is K. If it is determine that the number of times that the step control signal (STEP) has been generated is K, the controller 110 determines that the program cycle number is K. If it is determine that the number of times that the step control signal (STEP) has been generated is not K, the word line voltage generator 15 increases the program voltage (VP(J+1)) as much as the step voltage (see Vs in FIG. 7) in response to the step control signal (STEP) at step 214.

Thereafter, the steps 211 to 213 are repeatedly performed until the program cycle number becomes K. Referring to FIG. 7, the program voltage supplied to the word line WL1 during the (J+1)th to Kth program cycle (CY3) is gradually increased as much as the step voltage (Vs).

That, the (J+1)th to Kth program cycle (CY3), VP(J+1), VP(J+2), . . . , VPK are consecutively supplied to the word line WL1 as a program voltage. Furthermore, if the controller 110 determines that the program cycle number is K at step 213, the program operation of the step 211 is stopped at step 215.

As described above, in the circuit and method for controlling programming a program pulse width (i.e., the supply time of the program voltage) may be changed in each program period.

That is, as shown in FIG. 7, in a first half programming process (i.e., the first to Ith program cycle period (CY1)), the program voltage is supplied during a time (W1). In an intermediate program process (i.e., the (J+1)th to Kth program cycle period (CY2)), the program voltage is supplied during a time (W2) lower than the time (W1). Furthermore, in a second half programming process (i.e., the (J+1)th to Kth program cycle period (CY3)), the program voltage is supplied during a time (W3) longer than the time (W2).

Figure 8:
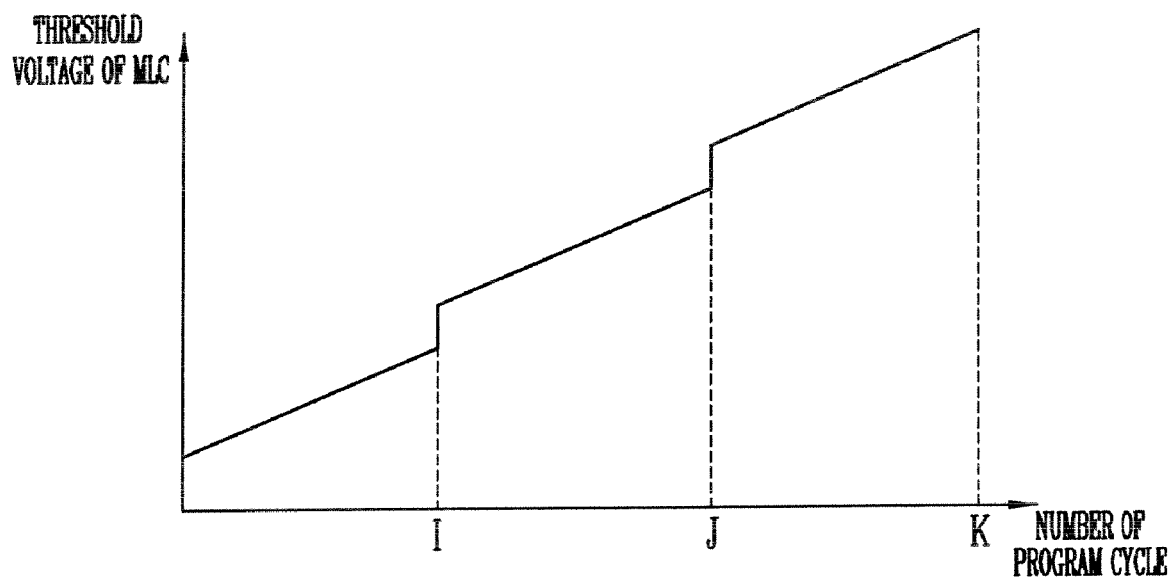
FIG. 8 is a graph showing variation in the threshold voltage of the MLC as the program cycle is in progress when the flash memory device is programmed by a herein described program method.

As a result, as in the graph shown in FIG. 8, threshold voltages of MLCs are changed. As a result, a program time is longer in the period (CY3) where MLCs into which data "01" should be programmed are programmed that in the period (CY2) where MLCs into which data "00" should be programmed are programmed. Therefore, over-programming of MLCs into which data "00" should be programmed can be prevented and a program time of MLCs into which data "01" should be programmed can be shortened.

As described above, a supply time of a word line bias voltage is selectively controlled according to the number of program cycles being in progress. Therefore, over-programming of MLCs can be prevented and an overall program time of a flash memory device can be shortened.

Although the foregoing description has been made with reference to various embodiments, it is to be understood that changes and modifications of the present invention may be made by the person of ordinary skill in the art without departing from the spirit and scope of the present invention defined by the appended claims.

What is claimed is:

1. A program control circuit of a flash memory device including a plurality of MLCs that share word lines and bit lines, comprising:

a controller that generates bit line masking signals and a step control signal in response to compare signals received from a verify data comparator, generates one of first to third cycle control signals and a first or second verify control signal based on the number of times that a step control signal is generated, outputs the bit line masking signals to a page buffer circuit connected to the bit lines, and outputs the step control signal to a word line voltage generator;

a clock signal generator that generates one of first to third clock signals and one of inverted first to third clock signals in response to one of the first to third cycle control signals; and a voltage select circuit that outputs a program bias voltage, which is generated from the word line voltage generator, to a X-decoder connected to the word lines during one of first to third predetermined times or outputs a verify bias voltage, which is generated from the word line voltage generator, to the X-decoder during a fourth predetermined time, in response to one of the first to third clock signals and one of the inverted first to third clock signals, which are received from the clock signal generator.

2. The program control circuit as claimed in claim 1, wherein the controller outputs the first cycle control signal and the first verify control signal until the number of times that the step control signal is generated reaches $I^{th}$ (I is an integer), outputs the second cycle control signal and the first or second verify control signal until the step control signal reaches (I+1)th to $J^{th}$ (J is an integer greater than I), and outputs the third cycle control signal and the second verify control signal until the step control signal reaches (J+1)$^{th}$ to $K^{th}$ (K is an integer greater than J).

3. The program control circuit as claimed in claim 2, wherein the clock signal generator generates the first clock signal and the inverted first clock signal when receiving the first cycle control signal generates the second clock signal and the inverted second clock signal when receiving the second cycle control signal, and generates the third clock signal and the inverted third clock signal when receiving the third cycle control signal.

4. The program control circuit as claimed in claim 2, wherein the program bias voltage includes a program voltage and a pass voltage, and the verify bias voltage includes a first verify voltage and a second verify voltage greater than the first verify voltage, and the word line voltage generator increases the program voltage as much as a set step voltage whenever the step control signal is received, generates the first verify voltage in response to the first verify control signal and generates the second verify voltage in response to the second verify control signal.

5. The program control circuit as claimed in claim 4, wherein the voltage select circuit includes:

a first switching circuit, which is connected between the program voltage and the X-decoder and is turned on or off in response to one of the first to third clock signals;

a second switching circuit, which is connected between the pass voltage and the X-decoder and is turned on or off in response to one of the first to third clock signals; and a third switching circuit, which is connected between the first or second verify voltage and the X-decoder and is turned on or off in response to one of the inverted first to third clock signals.

6. The program control circuit as claimed in claim 5, wherein one cycle of the third clock signal is greater than that of the second clock signal, and one cycle of the second clock signal is greater than that of the first clock signal, the first predetermined time is a time where the first and second switching circuits keep turned on at the same time in response to the first clock signal, the second predetermined time is a time where the first and second switching circuits keep turned on at the same time in response to the second clock signal, and the third predetermined time is a time where the first and second switching circuits keep turned on at the same time in response to the third clock signal, and the third predetermined time is longer than the second predetermined time, and the second predetermined time is longer than the first predetermined time.

7. The program control circuit as claimed in claim 1, wherein the page buffer circuit applies a bit line bias voltage for prohibiting programming into some or all of the bit lines in response to the bit line masking signals.

* * * * *

UNITED STATES PATENT AND TRADEMARK OFFICE
CERTIFICATE OF CORRECTION

PATENT NO. : 7,414,871 B2 Page 1 of 1
APPLICATION NO. : 11/776844
DATED : August 19, 2008
INVENTOR(S) : Hee Youl Lee et al.

It is certified that error appears in the above-identified patent and that said Letters Patent is hereby corrected as shown below:

In the Claims:

At Column 12, line 6, "first cycle control signal" should be -- first cycle control signal, --.

Signed and Sealed this

Twenty-fifth Day of November, 2008

JON W. DUDAS
*Director of the United States Patent and Trademark Office*